(12) United States Patent
Nagai et al.

(10) Patent No.: US 11,395,424 B2
(45) Date of Patent: Jul. 19, 2022

(54) ROTATING MECHANISM AND FOLDABLE TERMINAL

(71) Applicant: HUAWEI TECHNOLOGIES CO., LTD., Guangdong (CN)

(72) Inventors: Kenji Nagai, Yokohama (JP); Lexiong Peng, Dongguan (CN)

(73) Assignee: Huawei Technologies Co., Ltd., Guangdong (CN)

( * ) Notice: Subject to any disclaimer, the term of this patent is extended or adjusted under 35 U.S.C. 154(b) by 230 days.

(21) Appl. No.: 16/903,868

(22) Filed: Jun. 17, 2020

(65) Prior Publication Data

US 2020/0323091 A1 Oct. 8, 2020

Related U.S. Application Data

(63) Continuation of application No. PCT/CN2018/121498, filed on Dec. 17, 2018.

(30) Foreign Application Priority Data

Dec. 18, 2017 (CN) .......................... 201711362956.6
Dec. 14, 2018 (CN) .......................... 201811531779.4

(51) Int. Cl.
*H05K 5/03* (2006.01)
*H05K 5/02* (2006.01)
(Continued)

(52) U.S. Cl.
CPC ........ *H05K 5/0226* (2013.01); *H04M 1/0268* (2013.01); *H05K 5/0017* (2013.01)

(58) Field of Classification Search
CPC ...... H05K 5/03; H05K 5/0226; H05K 5/0017; H04M 1/0268; H06F 1/1616
(Continued)

(56) References Cited

U.S. PATENT DOCUMENTS 8,804,349 B2    8/2014  Lee et al.
8,824,166 B2 *  9/2014  Rohrbach ............ H05K 1/0298
                                                    248/467
(Continued)

FOREIGN PATENT DOCUMENTS

CN      103294113 A    9/2013
CN      103608745 A    2/2014
(Continued)

OTHER PUBLICATIONS

Sohu Media Platform:"OPPO will push black technology foldable phone, Samsung is busy applying for patents", Retrieved from the internet: https://rn.sohu.com/n/452386982/, Jun. 2016. total 8 pages.

(Continued)

*Primary Examiner* — Hai V Nguyen
(74) *Attorney, Agent, or Firm* — Womble Bond Dickinson (US) LLP

(57) ABSTRACT

The present invention discloses a rotating mechanism and a foldable terminal. The rotating mechanism includes a guide shaft, at least two rotating parts, and at least two constant-length units. The rotating parts are disposed on two sides of the guide shaft. An arc-shaped slot is disposed on the guide shaft. An arc-shaped part is disposed on the rotating part, and the arc-shaped part is disposed in the arc-shaped slot in a sliding manner. The constant-length unit is a long strip that has a fixed length and can be bent. A positioning end of the constant-length unit is fixedly connected to or rotationally connected to a rotating part on one side of the guide shaft, and a sliding end is connected to a rotating part on the other side of the guide shaft in a sliding manner. The foldable terminal has the foregoing rotating mechanism.

18 Claims, 13 Drawing Sheets

(51) Int. Cl.
*H04M 1/02* (2006.01)
*H05K 5/00* (2006.01)

(58) Field of Classification Search
USPC .................................................... 455/575.3
See application file for complete search history.

(56) References Cited

U.S. PATENT DOCUMENTS

| | | | | |
|---|---|---|---|---|
| 9,163,775 | B2* | 10/2015 | Rohrbach | H01F 7/0252 |
| 9,164,547 | B1 | 10/2015 | Kwon et al. | |
| 9,173,287 | B1 | 10/2015 | Kim et al. | |
| 9,173,288 | B1 | 10/2015 | Kim | |
| 9,179,559 | B1 | 11/2015 | Kim | |
| 9,204,565 | B1 | 12/2015 | Lee et al. | |
| 9,235,239 | B2 | 1/2016 | Van Dijk et al. | |
| 9,348,450 | B1 | 5/2016 | Kim | |
| 9,535,452 | B2* | 1/2017 | Ahn | G06F 1/1615 |
| 9,612,621 | B2 | 4/2017 | Lee et al. | |
| 9,839,147 | B2* | 12/2017 | Rohrbach | F16M 11/242 |
| 10,251,287 | B2* | 4/2019 | Rohrbach | F16M 11/242 |
| 10,268,245 | B2* | 4/2019 | Lin | E05D 3/06 |
| 10,274,996 | B2* | 4/2019 | Lin | E05D 3/06 |
| 10,274,997 | B2* | 4/2019 | Lin | G06F 1/1616 |
| 10,545,538 | B2* | 1/2020 | Jia | G06F 1/1681 |
| 10,558,277 | B2* | 2/2020 | Henell | H05K 5/0226 |
| 10,684,658 | B2* | 6/2020 | Lin | H04M 1/0268 |
| 10,694,629 | B2* | 6/2020 | Rohrbach | G06F 1/1615 |
| 10,754,395 | B2* | 8/2020 | Sanchez | H05K 5/0086 |
| 10,810,005 | B2* | 10/2020 | Hua | G06F 9/44505 |
| 10,817,030 | B2* | 10/2020 | Pelissier | G06F 1/1652 |
| 10,863,635 | B2* | 12/2020 | Watamura | G06F 1/1626 |
| 10,877,522 | B2* | 12/2020 | Jia | G06F 1/1652 |
| 10,904,371 | B1* | 1/2021 | Song | G06F 1/1652 |
| 10,928,863 | B2* | 2/2021 | Pelissier | G06F 1/1681 |
| 10,932,381 | B1* | 2/2021 | Liu | G02F 1/133314 |
| 10,963,020 | B2* | 3/2021 | Kim | G06F 1/1652 |
| 11,188,120 | B2* | 11/2021 | Myung | H04M 1/0222 |
| 11,199,874 | B2* | 12/2021 | Lin | G06F 1/1616 |
| 2012/0044620 | A1 | 2/2012 | Song et al. | |
| 2012/0307423 | A1 | 12/2012 | Bohn et al. | |
| 2012/0307472 | A1 | 12/2012 | Bohn et al. | |
| 2013/0050973 | A1* | 2/2013 | Rohrbach | H05K 5/0204 |
| | | | | 348/145 |
| 2014/0361142 | A1* | 12/2014 | Rohrbach | F16M 11/22 |
| | | | | 248/176.1 |
| 2014/0375530 | A1 | 12/2014 | Delaporte | |
| 2015/0233162 | A1 | 8/2015 | Lee et al. | |
| 2015/0257289 | A1 | 9/2015 | Lee et al. | |
| 2015/0257290 | A1 | 9/2015 | Lee | |
| 2016/0062408 | A1 | 3/2016 | Lee et al. | |
| 2016/0062412 | A1 | 3/2016 | Park et al. | |
| 2016/0116944 | A1 | 4/2016 | Lee et al. | |
| 2016/0174363 | A1* | 6/2016 | Rohrbach | F16M 11/041 |
| | | | | 174/350 |
| 2016/0195901 | A1 | 7/2016 | Kauhaniemi | |
| 2016/0195902 | A1 | 7/2016 | Huh et al. | |
| 2016/0295709 | A1* | 10/2016 | Ahn | G06F 1/1652 |
| 2017/0061836 | A1 | 3/2017 | Kim et al. | |
| 2017/0285691 | A1 | 10/2017 | Baek | |
| 2018/0039339 | A1* | 2/2018 | Henell | G06F 1/1615 |
| 2018/0049329 | A1* | 2/2018 | Seo | G06F 1/1652 |
| 2018/0070464 | A1* | 3/2018 | Rohrbach | H04B 1/3877 |
| 2018/0077810 | A1* | 3/2018 | Moon | H05K 5/0226 |
| 2018/0275725 | A1* | 9/2018 | Lin | G06F 1/1616 |
| 2019/0182972 | A1* | 6/2019 | Rohrbach | H04B 1/3877 |
| 2019/0212786 | A1* | 7/2019 | Lin | H04M 1/0216 |
| 2019/0339742 | A1* | 11/2019 | Jia | H04M 1/0268 |
| 2020/0110444 | A1* | 4/2020 | Jia | G06F 1/1681 |
| 2020/0281085 | A1* | 9/2020 | Jia | G06F 1/1681 |
| 2020/0341523 | A1* | 10/2020 | Chen | E05D 3/122 |
| 2021/0011514 | A1* | 1/2021 | Wang | G06F 1/1616 |

FOREIGN PATENT DOCUMENTS

| | | |
|---|---|---|
| CN | 204515586 U | 7/2015 |
| CN | 105096756 A | 11/2015 |
| CN | 105491193 A | 4/2016 |
| CN | 105652975 A | 6/2016 |
| CN | 105810104 A | 7/2016 |
| CN | 105872136 A | 8/2016 |
| CN | 205446377 U | 8/2016 |
| CN | 205510132 U | 8/2016 |
| CN | 205596165 U | 9/2016 |
| CN | 205715240 U | 11/2016 |
| CN | 205721487 U | 11/2016 |
| CN | 205750631 U | 11/2016 |
| CN | 205750634 U | 11/2016 |
| CN | 205806214 U | 12/2016 |
| CN | 205847346 U | 12/2016 |
| CN | 106328007 A | 1/2017 |
| CN | 106559531 A | 4/2017 |
| CN | I06559529 A | 4/2017 |
| CN | 106788536 A | 5/2017 |
| CN | 206210287 U | 5/2017 |
| CN | 206559426 U | 10/2017 |
| CN | 107370848 A | 11/2017 |
| KR | 20150099676 A | 9/2015 |
| KR | 20150120742 A | 10/2015 |
| KR | 20160129724 A | 11/2016 |
| KR | 20160145420 A | 12/2016 |
| WO | 2016209247 A1 | 12/2016 |

OTHER PUBLICATIONS

Touchpanel:"Lenovo Research Institute develops modular flexible", Mobile News Online, Retrieved from the internet: http://www.51touch.com/touchscreen/news/dynamic/201608/08-43200.html, Aug. 2016. total 4 pages.

Tencent Video:"Lenovo shows Folio tablet screen can actually be folded", Retrieved from the internet: https://v.qq.com/x/page/c05285rc007.html. Mobile China, Jul. 21, 2017. total 2 pages.

* cited by examiner

ROTATING MECHANISM AND FOLDABLE TERMINAL

CROSS-REFERENCE TO RELATED APPLICATIONS

This application is a continuation of International Application No. PCT/CN2018/121498, filed on Dec. 17, 2018, which claims priority to Chinese Patent Application No. 201811531779.4, filed on Dec. 14, 2018, and Chinese Patent Application No. 201711362956.6, filed on Dec. 18, 2017. All of these applications are hereby incorporated by reference in their entireties.

TECHNICAL FIELD

The present invention relates to electronic devices, and in particular, to a rotating mechanism and a foldable terminal.

BACKGROUND

Flexible display technologies gradually mature, so that a display manner of a terminal changes greatly. One of these changes is the emergence of a foldable mobile phone. Because a display of the foldable mobile phone can flexibly change based on different use scenarios to switch a mode, the foldable mobile phone becomes a main direction of a next-generation mobile phone developed by mainstream device vendors.

A flexible display is only one component in a foldable terminal device. To ensure that the entire terminal device is foldable, overall cooperation of other parts, such as a structure, is further required. Therefore, a rotating mechanism that can be used to fold the terminal device is further required. In addition, in a folded area of the device, because components have different folding radii, and have different moving tracks during folding, it is very difficult to consider overall appearances of the device in a folded state, in an unfolded state, and at any intermediate angle. The present invention also provides an appearance processing solution applicable to the rotating mechanism.

For an externally folded device, there are two main directions: a sliding screen and a fastened screen. As the name implies, the sliding screen means that in a folding process, the screen slides on a mechanical part with movement of a rotating mechanism, and the fastened screen means that the screen is fastened in relative to a mechanical part of the device, and in a folding process of the device, a rotating mechanism changes with the screen to change, and no slipping occurs between the screen and the mechanical part.

Usually, the flexible display is a relatively fragile component, and cannot bear a large pull deformation (pull pressure) in the folding process. Therefore, for a terminal device with the fastened screen, a main function is that a rotating mechanism needs to implement a length change in a rotation process.

A key defect of a sliding solution in the prior art is that a screen needs to provide specific pull force when a mechanism slides. If no screen or no flexible component similar to the screen exists for connecting housings on two sides, a device cannot implement a sliding function during rotating. Another defect is that when the screen is unfolded, the screen is extruded from the two sides of the device to the middle of the device, and sliding may occur. In this case, the screen arches. This may affect an appearance, or may even destroy the screen.

SUMMARY

A technical problem to be resolved in the present invention is to provide a rotating mechanism and a foldable terminal, to reduce force exerted on a flexible display in a folding process.

To resolve the foregoing technical problem, according to one aspect, the present invention provides a rotating mechanism, including a guide shaft, at least two rotating parts, and at least two constant-length units. The rotating parts are disposed on two sides of the guide shaft. An arc-shaped slot is disposed on the guide shaft. An arc-shaped part is disposed on the rotating part, and the arc-shaped part is disposed in the arc-shaped slot in a sliding manner, so that the rotating part can be rotated in relative to the guide shaft. The constant-length unit is a long strip that has a fixed length and that can be bent, the constant-length unit has a positioning end and a sliding end that correspond to each other in a length direction of the constant-length unit, the positioning end is fixedly connected to or rotationally connected to the rotating part located on one side of the guide shaft, and the sliding end is connected, in a sliding manner along a length direction of the constant-length unit, to the rotating part located on the other side of the guide shaft. The positioning end and the sliding end are disposed on each rotating part.

In one embodiment, the guide shaft includes a first sub-shaft and a second sub-shaft. The first sub-shaft and the second sub-shaft are parallel to each other and are disposed in relative to each other, and the first sub-shaft and the second sub-shaft are fixedly connected. The arc-shaped slot is a gap disposed between the first sub-shaft and the second sub-shaft. The arc-shaped slot is formed by using the gap between the first sub-shaft and the second sub-shaft. This can facilitate processing and molding, and facilitate assembly of the arc-shaped part into the arc-shaped slot.

In one embodiment, an arc-shaped guide slot is disposed on the guide shaft, and the constant-length unit slides through the arc-shaped guide slot. By using the arc-shaped guide slot, the constant-length unit can be bent according to a preset radian, so that a sliding end of the constant-length unit can move according to a preset track, and an external force exerted on a flexible display is reduced. In addition, a length change caused because the constant-length unit arches when the constant-length unit is pressed can be avoided.

In one embodiment, the constant-length unit includes a plurality of chain segments, the plurality of chain segments are connected in series, and two adjacent chain segments are rotationally connected. Bending of the constant-length unit may be implemented through rotation between the chain segments.

Alternatively, the constant-length unit is made of a material that can be bent. Bending of the constant-length unit is implemented by using a characteristic of the material that can be bent.

In one embodiment, a sliding slot is disposed on the rotating part, the sliding slot has two slot walls disposed opposite to each other, a slide rail is disposed on each of the slot walls, a sliding block is disposed on the sliding end of the constant-length unit, the sliding block is disposed in the sliding slot in a sliding manner, sliding ears are disposed on two opposite sides of the sliding block, and the sliding ears are disposed in the slide rail in a sliding manner. Through sliding cooperation of the sliding block and the sliding slot, and cooperation of the sliding ear and the slide rail, stability of sliding of the sliding end of the constant-length unit can be ensured, and the sliding end can be limited on the rotating part, so that the sliding end is not separated from the rotating part.

In one embodiment, the rotating part includes a rotating plate and at least two rotating blocks. The rotating blocks are all fastened on the rotating plate. Two of the rotating blocks are disposed with a gap, and the gap between the two rotating blocks forms the sliding slot. The slide rail is disposed between the rotating block and the rotating plate. Through cooperation of the rotating block and the rotating plate, it can be convenient to form the sliding slot and the slide rail. This facilitates processing and manufacture, and facilitates assembly and connection between the rotating part and the sliding block.

In one embodiment, the arc-shaped part is disposed on each of the rotating blocks, and the constant-length unit is limited between two arc-shaped parts. The two arc-shaped parts may have a function for limiting the constant-length unit, to prevent the constant-length unit from shaking in the bending process and affecting a sliding track of the sliding end.

In one embodiment, the rotating mechanism further includes an appearance shielding component, the appearance shielding component includes a middle shaft and two shielding plates, the two shielding plates each are rotationally connected to the middle shaft, and the two shielding plates respectively cooperate with the rotating parts on the two sides of the guide shaft in a sliding manner. The appearance shielding component may shield back surfaces of the rotating parts, so that a back surface structure of a foldable terminal is simple. Therefore, an appearance can be very simple.

In one embodiment, a middle slot is disposed on a side, far away from the guide shaft, of the middle shaft, and two sub-shafts are disposed on the middle shaft. The middle slot is located between the two sub-shafts. The two shielding plates are rotationally connected to the two sub-shafts respectively. In a folded state, close end parts of the two shielding plates are located in the middle slot. In an unfolded state, the close end parts of the two shielding plates press against each other. The close end parts of the two shielding plates can be accommodated by using the middle slot, to ensure that the close end parts of the two shielding plates can press against each other in the unfolded state, to completely shield the guide shaft and the two rotating parts.

According to another aspect, the present invention provides a foldable terminal, including the foregoing rotating mechanism, two body parts, and a flexible display. The two body parts are connected by using the rotating mechanism, the flexible display includes two fastened parts and one bent part, the two fastened parts are fixedly connected to the two body parts respectively, and the bent part is disposed in relative to the rotating mechanism.

In one embodiment, through cooperation of arc-shaped slots and arc-shaped parts, the two rotating parts can be rotated in relative to the guide shaft, to implement folding. When the rotating part is rotated around the guide shaft, the sliding end of the constant-length unit slides in relative to the other rotating part, a connection line with a constant length can be formed between the sliding ends of the two constant-length units, and a position of the connection line overlaps a position of the flexible display, to ensure that a total length of the foldable terminal on a surface on which the flexible display is located does not change. In this way, in the folding process of the foldable terminal, an external force exerted on the flexible display is the slightest. This protects the flexible display and prolongs a service life.

BRIEF DESCRIPTION OF DRAWINGS

To describe the technical solutions in the embodiments of the present invention more clearly, the following briefly describes the accompanying drawings required for describing the embodiments or the prior art.

DESCRIPTION OF EMBODIMENTS

The following clearly describes the technical solutions in the embodiments of the present invention with reference to the accompanying drawings in the embodiments of the present invention.

Figure 1:
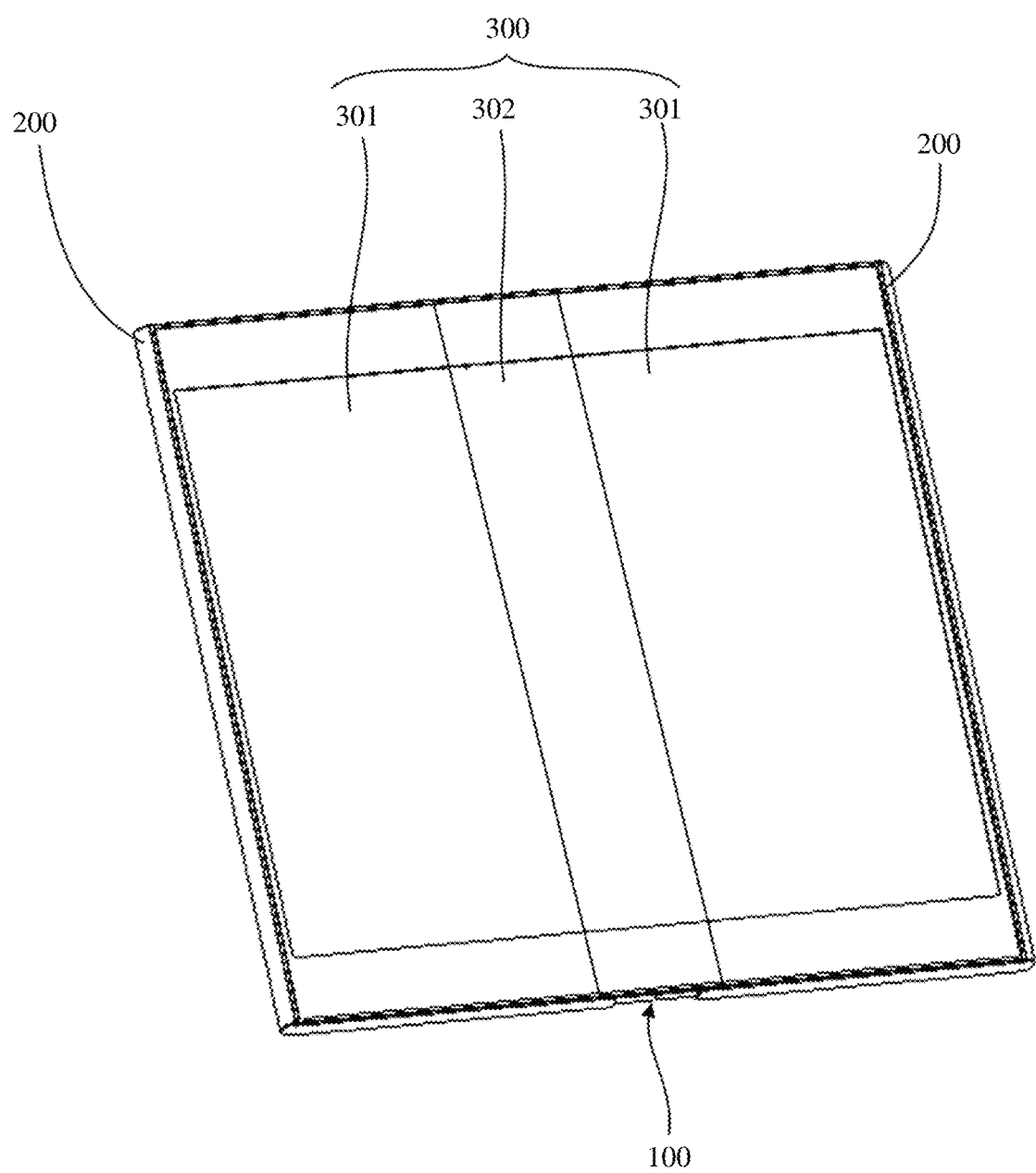
FIG. 1 is a schematic structural diagram of a front surface of a foldable terminal in an unfolded state according to an embodiment of the present invention.
Figure 2:
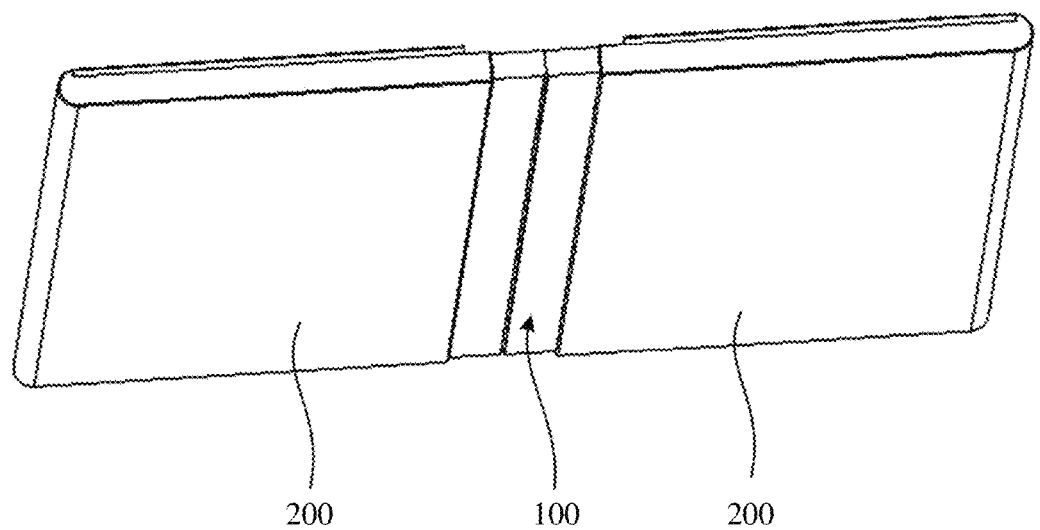
FIG. 2 is a schematic structural diagram of a back surface of the foldable terminal in FIG. 1 in an unfolded state.
Figure 3:
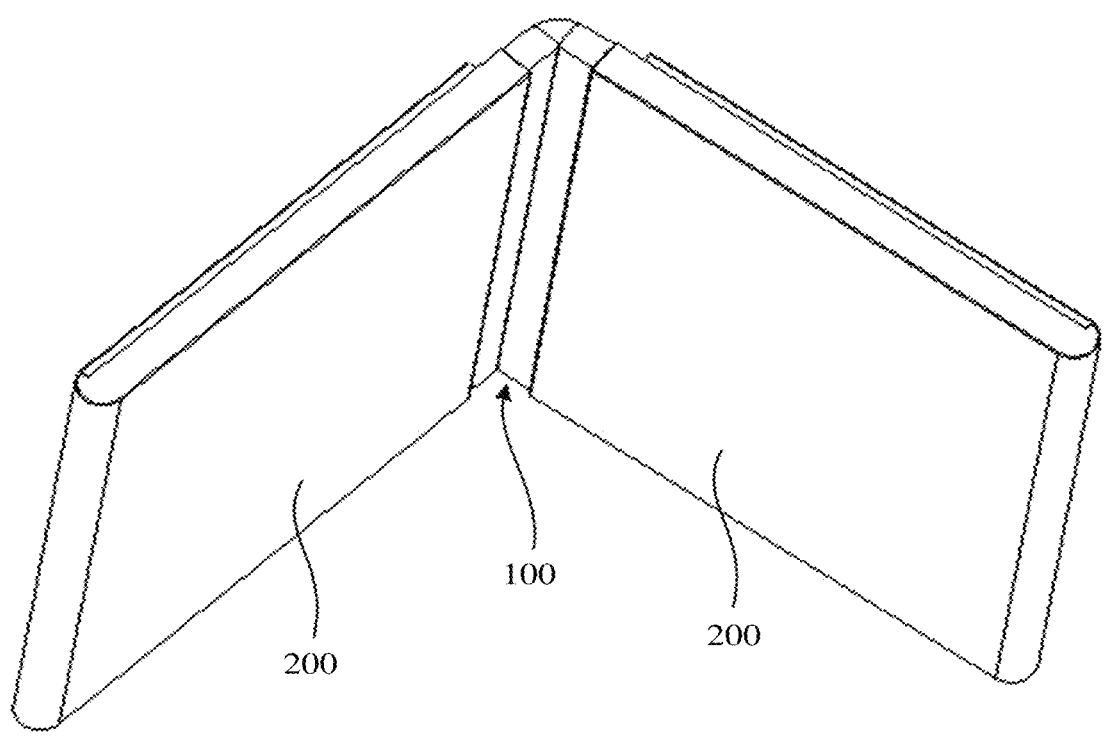
FIG. 3 is a schematic structural diagram of another angle of a back surface of the foldable terminal in FIG. 2 in a half-folded state.

FIG. 1 to FIG. 3 show a foldable terminal according to an embodiment of the present invention. The foldable terminal includes a rotating mechanism 100, two body parts 200, and a flexible display 300. The two body parts 200 of a foldable mobile phone are connected by using the rotating mechanism 100, and the two body parts 200 can be rotated in relative to each other by using the rotating mechanism 100, to fold and unfold the foldable mobile phone. The flexible display 300 includes two fastened parts 301 and one bent part 302. The two fastened parts 301 are fixedly connected to the two body parts respectively. The bent part 302 is disposed in relative to the rotating mechanism 100. When the foldable mobile phone is in a folded state, the bent part 302 can be bent in an arc shape, and the flexible display 300 is located on an outside surface of the entire foldable mobile phone.

The foldable terminal in this embodiment may be various types of terminal apparatuses with a flexible display covering an outside surface, for example, a foldable mobile phone, a notebook computer, a tablet computer, a foldable display device, a foldable display, a wearable device, or a PDA.

Figure 4:
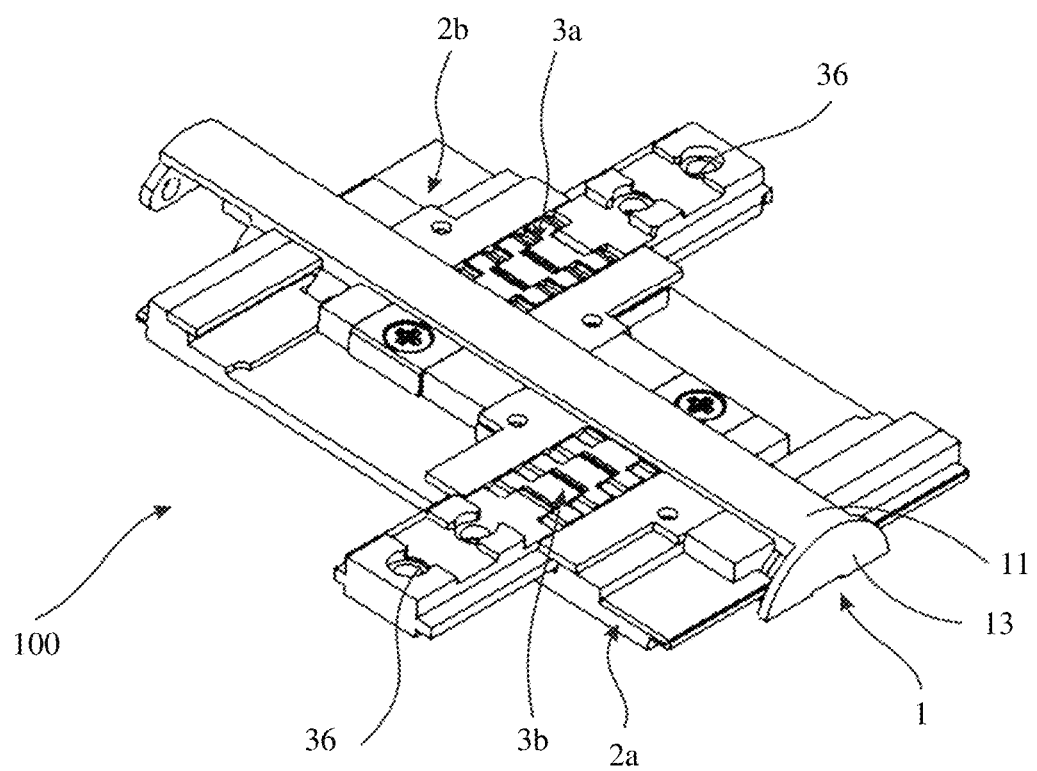
FIG. 4 is a schematic structural diagram of a rotating mechanism of a foldable terminal according to an embodiment of the present invention.

As shown in FIG. 4, the rotating mechanism 100 includes a guide shaft 1, at least two rotating parts 2a and 2b, and at least two constant-length units 3a and 3b. The rotating parts 2a and 2b are disposed on two sides of the guide shaft 1. Relative rotation between the rotating parts 2a and 2b on the two sides may be implemented by using the guide shaft 1, so that the foldable terminal can be folded or unfolded. Referring to FIG. 3 and FIG. 4, in some embodiments, there are two rotating parts, and the two rotating parts 2a and 2b are respectively located on the two sides of the guide shaft. In addition, in another embodiment, a quantity of rotating parts is not limited to 2, there may alternatively be three rotating parts, one rotating part is disposed on one side of the guide shaft, and two rotating parts are disposed on the other side of the guide shaft. Alternatively, there may be four rotating parts, and two of the four rotating parts are disposed on each of the two sides of the guide shaft.

Figure 5:
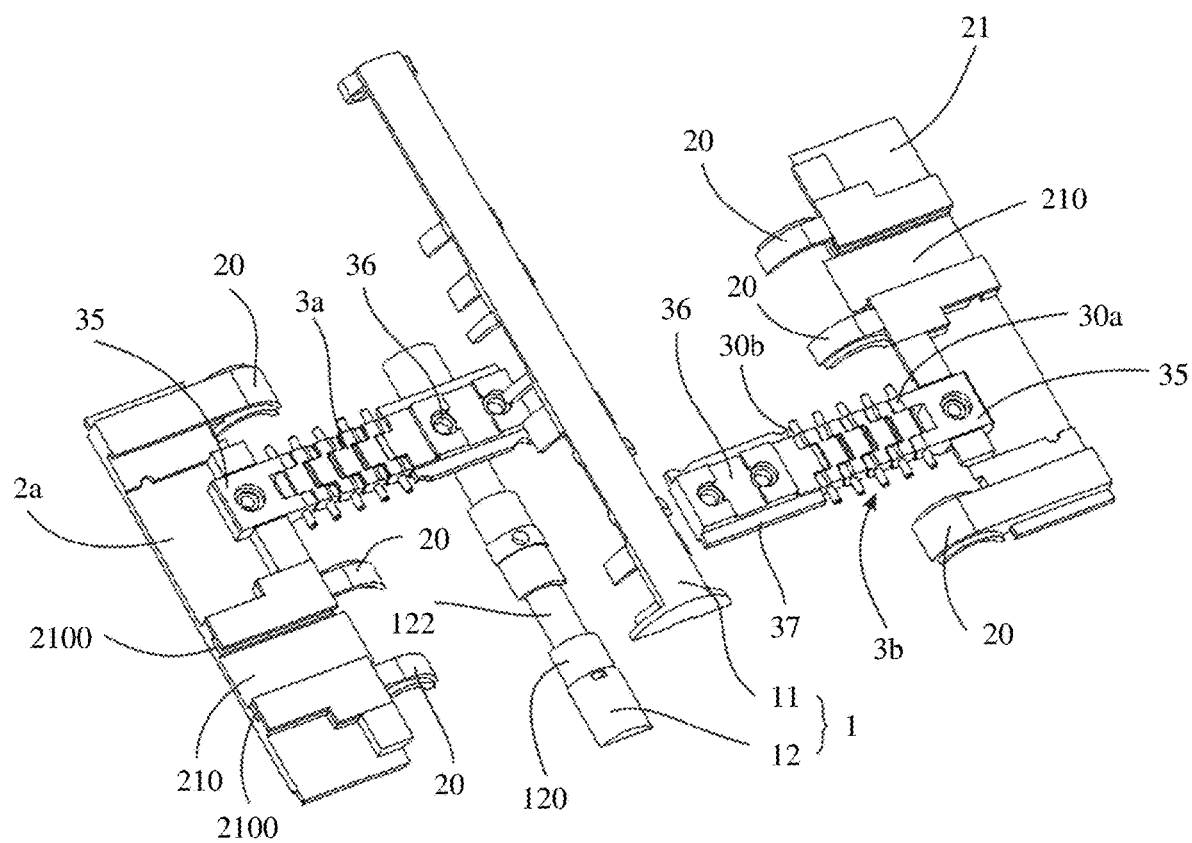
FIG. 5 is a schematic exploded view of the rotating mechanism in FIG. 4.

As shown in FIG. 5, in some embodiments, an arc-shaped slot 120 is disposed on the guide shaft 1. An arc-shaped part 20 is disposed on the rotating part 2a, and the arc-shaped part 20 is disposed on the arc-shaped slot 120 in a sliding manner, so that the rotating part 2a can be rotated in relative to the guide shaft 1. Through cooperation between arc-shaped slots 120 and arc-shaped parts 20, the two rotating parts 2 can be rotated in relative to the guide shaft 1. In this embodiment, the arc-shaped slots 120 cooperate with the arc-shaped parts 20 in a one-to-one correspondence. Certainly, in another embodiment, there may be one arc-shaped slot 120, and the arc-shaped parts 20 of the two rotating parts 2 may be disposed in a same arc-shaped slot 120 side by side along a shaft direction of the guide shaft 1.

In some embodiments, there are two constant-length units 3a and 3b. The constant-length units 3a and 3b are long strips that have a fixed length and can be bent. The constant-length units 3a and 3b have corresponding positioning ends 30a and sliding ends 30b in length directions of the constant-length units 3a and 3b. A positioning end 30a of the constant-length unit 3a is fixedly connected to or rotationally connected to the rotating part 2a located on one side of the guide shaft 1. A sliding end 30b of the constant-length unit 3a is connected, in a sliding manner along a length direction of the constant-length unit 3a, to the rotating part 2b located on the other side of the guide shaft 1. Correspondingly, a positioning end 30a of the constant-length unit 3b is fixedly connected to or rotationally connected to the rotating part 2b. A sliding end 30b of the constant-length unit 3b is connected to the other rotating part 2a in a sliding manner. Therefore, the positioning end 30a and the sliding end 30b are disposed on each of the rotating parts 2a and 2b. In addition, in another embodiment, a quantity of constant-length units is not limited to 2, and there may alternatively be three constant-length units. Positioning ends of two of the constant-length units may be fixedly connected to the rotating part 2a, and sliding ends of the two constant-length units may be connected to the rotating part 2b in a sliding manner. A positioning end of the other constant-length unit may be fixedly connected to the rotating part 2b, and a sliding end of the other constant-length unit may be connected to the rotating part 2a in a sliding manner. Therefore, the positioning end 30a and the sliding end 30b are disposed on each of the rotating parts 2a and 2b. Further, there may be four or more constant-length units.

The sliding ends 30b of the constant-length units 3a and 3b can be connected to the body parts 200. When the two rotating parts 2a and 2b are rotated around the guide shaft 1, the sliding end 30b of the constant-length unit 3a slides in relative to the rotating part 2b, and the sliding end 30b of the constant-length unit 3b slides in relative to the other rotating part 2a. Sliding of the sliding ends 30b of the two constant-length units 3a and 3b can drive the two body parts 200 to move, and the body parts 200 can drive the fastened parts 301 of the flexible display 300 to move, so as to fold or unfold the foldable terminal and the flexible display 300 of the foldable terminal.

Figure 7:
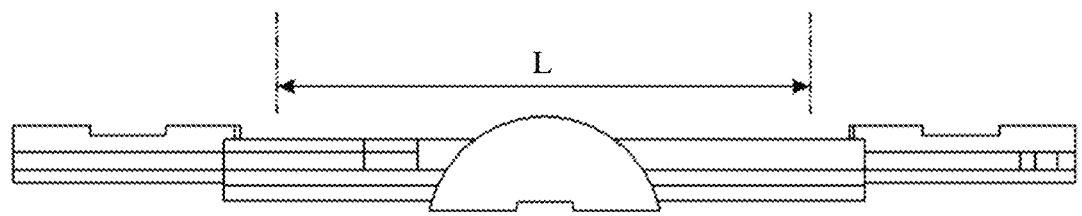
FIG. 7 is a schematic structural diagram of a side surface of the rotating mechanism in FIG. 4 in an unfolded state.
Figure 8:
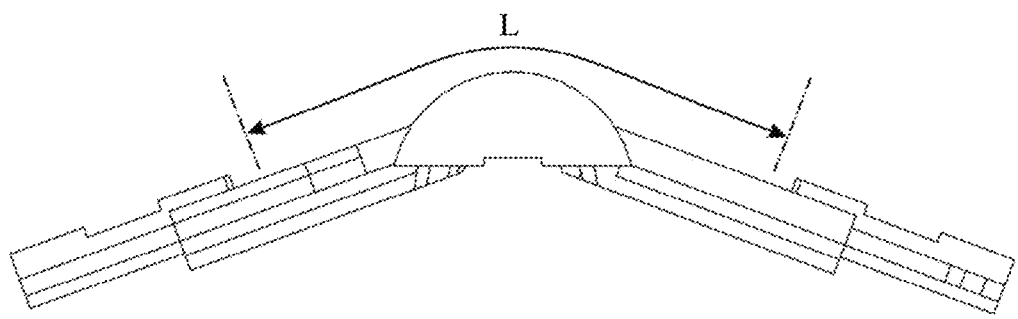
FIG. 8 is a schematic structural diagram of a side surface of the rotating mechanism in FIG. 4 in a half-folded state.
Figure 9:
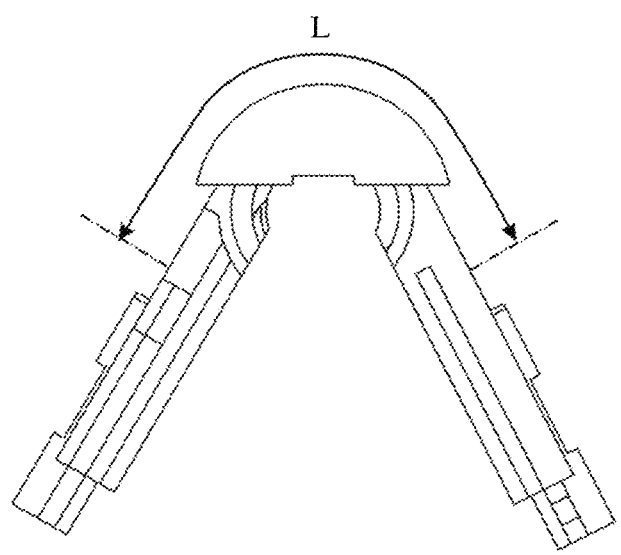
FIG. 9 is a schematic structural diagram of a side surface after the rotating mechanism in FIG. 8 is further folded.
Figure 10:
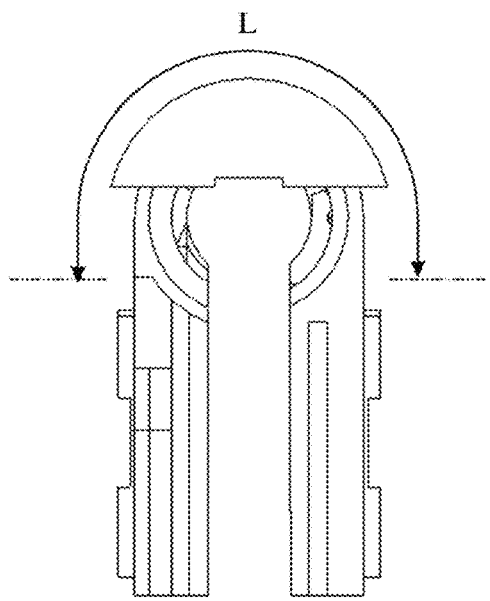
FIG. 10 is a schematic structural diagram of a side surface after the rotating mechanism in FIG. 9 is completely folded.

FIG. 7 is a schematic diagram of the rotating mechanism 100 in a fully unfolded state. FIG. 8 and FIG. 9 are schematic diagrams of the rotating mechanism 100 in a folding process. FIG. 10 is a schematic diagram of the rotating mechanism 100 in a fully folded state. In the folding process, the rotating parts 2a and 2b are rotated in a radian determined by the arc-shaped parts 20 and the arc-shaped slots 120. At central positions in a thickness direction of the arc-shaped parts 20, a length of a central connection line between the two sliding ends 30b changes with the rotation of the rotating parts 2a and 2b. On an outer folding side of the foldable terminal, there is an outer folding side connection line parallel to the central connection line. Two ends of the outer folding side connection line are aligned with two ends of the central connection line in a thickness direction of the foldable terminal. When the outer folding side connection line is gradually away from the central connection line, a length of the outer folding side connection line first gradually decreases and then gradually increases due to impact of the rotation radian. There is a connection line whose length is not affected by the rotation of the rotating parts 2a and 2b at a position in a specific distance from the center connection line. To be specific, a connection line with a constant length L can be formed between the sliding ends 30b of the two constant-length units 3. A position of the connection line overlaps a position of the flexible display 300, to ensure that a total length of the foldable terminal on a surface on which the flexible display 300 is located does not change. In this way, in the folding process of the foldable terminal, external force exerted on the flexible display 300 is the slightest, so as to protect the flexible display 300.

The central position in the thickness direction of the arc-shaped part 20 may be a rotation center axis of the rotating mechanism 100 during rotation. The central position in the thickness direction of the arc-shaped part 20 may be a position of a circle center of the arc-shaped part 20. A connection line between projections of the two sliding ends 30b on a plane that is perpendicular to the rotation center axis is the central connection line. The central connection line is a connection line along a sliding direction of the two sliding ends 30b and is a tangent along a circular arc of the rotation center axis (as shown in FIG. 8 to FIG. 10, there is an included angle in the sliding direction of the sliding ends 30b). It is assumed that the foldable terminal has a plurality of outer folding side connection lines parallel to the central connection line on an outer side of the central connection line, and two ends of the outer folding side connection line are aligned with two ends of the central connection line in a thickness direction of the foldable terminal. In the folding process of the terminal, the plurality of outer folding side connection lines are in a direction gradually away from the central connection line. Lengths of the outer folding side connection lines first gradually decrease and then gradually increase due to impact of the rotation radian. In addition, there is an outer folding side connection line L whose length is not affected by the rotation of the rotating parts 2a and 2b at a position in a specific distance from the central connection line along the thickness direction of the terminal (as shown in FIG. 7 to FIG. 10). A position of the connection line overlaps the position of the flexible display 300.

Figure 6:
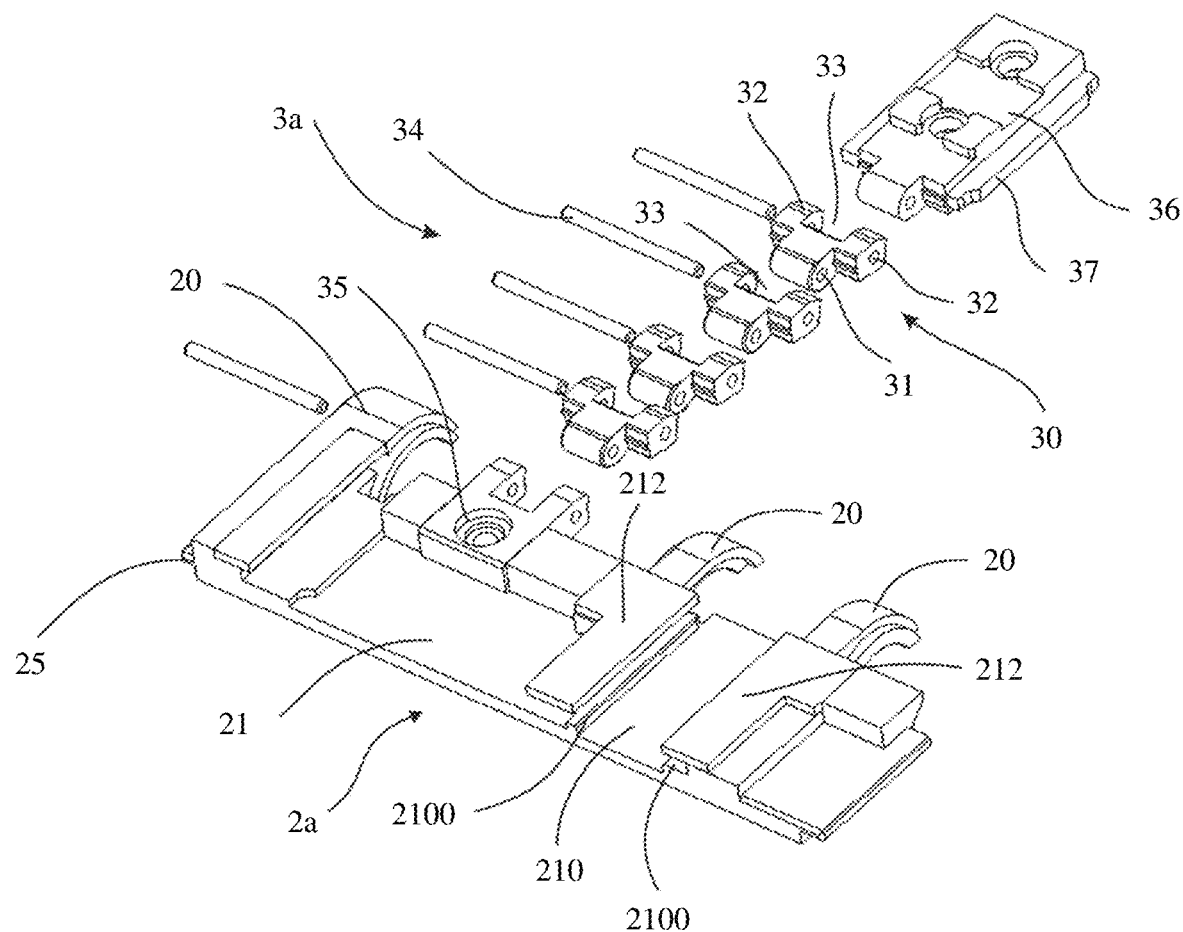
FIG. 6 is a schematic exploded view of a rotating part and a constant-length unit of the rotating mechanism in FIG. 4.

As shown in FIG. 4 to FIG. 6, in some embodiments, the guide shaft 1 includes a first sub-shaft 11 and a second sub-shaft 12. The first sub-shaft 11 and the second sub-shaft 12 are parallel to each other and are disposed in relative to each other. The first sub-shaft 11 is fixedly connected to the second sub-shaft 12. The arc-shaped slot 120 is a gap disposed between the first sub-shaft 11 and the second sub-shaft 12. The arc-shaped slot 120 is formed by using the gap between the first sub-shaft 11 and the second sub-shaft 12. This can facilitate processing and molding, and facilitate assembly of the arc-shaped part 20 into the arc-shaped slot 120. In a specific embodiment, a concave arc surface may be disposed on the first sub-shaft 11, a convex arc surface may be disposed on the second sub-shaft 12, and the convex arc surface and the concave arc surface are disposed in relative to each other. After the first sub-shaft 11 and the second sub-shaft 12 are assembled, a gap is formed between the convex arc surface and the concave arc surface, and the gap is the arc-shaped slot 120.

In some embodiments, an arc-shaped guide slot 122 is disposed on the guide shaft 1, and a constant-length unit 3 slides through the arc-shaped guide slot 122. That a constant-length unit 3 slides through the arc-shaped guide slot 122 means that the constant-length unit 3 passes through the arc-shaped guide slot 122, a part of the constant-length unit 3 is located in the arc-shaped guide slot, and the constant-length unit 3 can slide in the arc-shaped guide slot 122 along a length direction of the constant-length unit 3. By using the arc-shaped guide slot 122, the constant-length unit 3 can be bent according to a preset radian, so that a sliding end 30b of the constant-length unit 3 can move according to a preset track, and external force exerted on the flexible display 300 is reduced. In addition, a length change caused because the constant-length unit 3 arches when the constant-length unit 3 is pressed can be avoided.

As shown in FIG. 6, in some embodiments, the constant-length unit 3 includes a plurality of chain segments 30, the plurality of chain segments 30 are connected in series, and two adjacent chain segments 30 are rotationally connected. The constant-length unit 3 can be bent through rotation between chain segments 30. More specifically, each chain segment 30 includes a first connection block 31 and two second connection blocks 32. In a same chain segment 30, the first connection block 31 is fastened between the two second connection blocks 32, a connection slot 33 is formed between the two second connection blocks 32, and the first connection block 31 is rotationally connected to a connection slot 33 of another adjacent chain segment 30 by using a rotating shaft 34.

In this embodiment, a chain segment 30 located at a positioning end 30a of the constant-length unit 3 is connected to a rotating part 2 by using a fastened part 35. The fastened part 35 is fixedly connected to the rotating part 2, and the fastened part 35 is rotationally connected to the chain segment 30. Herein, in another embodiment, the chain segment 30 located at the positioning end 30a of the constant-length unit 3 may be rotationally connected to or fixedly connected to the rotating part 2 directly.

As shown in FIG. 6, in some embodiments, a sliding slot 210 is disposed on the rotating part 2. The sliding slot 210 has two slot walls that are disposed opposite to each other. A slide rail 2100 is disposed on each slot wall. A sliding block 36 is disposed on the sliding end 30b of the constant-length unit 3. The sliding block 36 is disposed in the sliding slot 210 in a sliding manner. Sliding ears 37 are disposed on two opposite sides of the sliding block 36. The sliding ears 37 are disposed in the slide rail 2100 in a sliding manner. Through sliding cooperation of the sliding block 36 and the sliding slot 210, and cooperation of the sliding ear 37 and the slide rail 2100, stability of sliding of the sliding end 30b of the constant-length unit 3 can be ensured, and the sliding end 30b can be limited on the rotating part 2, so that the sliding end 30b is not separated from the rotating part 2. Further, two ends of the rotating shaft 34 extend to outer sides of the chain segment 30 and can cooperate with the slide rail 2100 in a sliding manner. This can ensure stability of sliding of the constant-length unit 3. The sliding block 36 may be fixedly connected to a body part 200, to drive the body part 200 to move.

The rotating part 2 includes a rotating plate 21 and at least two rotating blocks 212. The rotating blocks 212 are all fastened on the rotating plate 21. Two of the rotating blocks 212 are disposed with a gap, and the gap between the two rotating blocks 212 forms the sliding slot 210. The slide rail 2100 is disposed between the rotating block 212 and the rotating plate 21. Through cooperation of the rotating block 212 and the rotating plate 21, it can be convenient to form the sliding slot 210 and the slide rail 2100. This facilitates processing and manufacture, and facilitates assembly and connection between the rotating part 2 and the sliding block 36.

An arc-shaped part 20 is disposed on each rotating block 212. The constant-length unit 3 is limited between two arc-shaped parts 20. The two arc-shaped parts 20 may have a function for limiting the constant-length unit 3, to prevent the constant-length unit 3 from shaking in a bending process and affecting a sliding track of the sliding end 30b.

Figure 11:
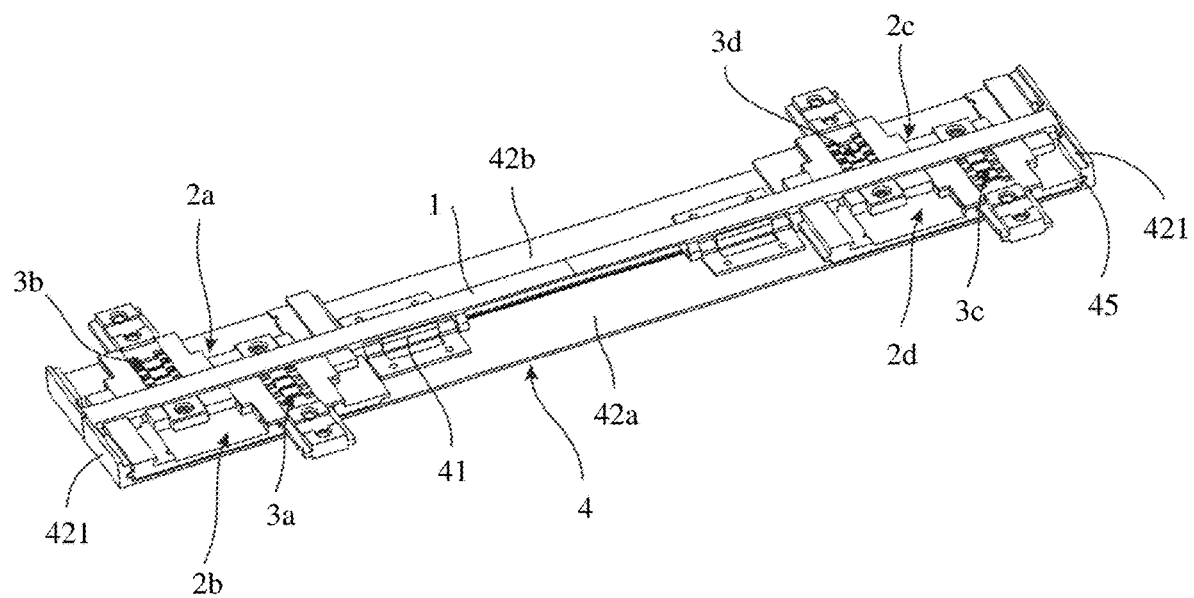
FIG. 11 is a schematic structural diagram of a rotating mechanism having an appearance shielding component according to the present invention.

Further, as shown in FIG. 11, in some embodiments, a rotating mechanism 100 further includes two rotating parts 2c and 2d, and two constant-length units 3c and 3d. Structures of the two rotating parts 2c and 2d are completely the same as those of the two rotating parts 2a and 2b. Structures of the constant-length units 3c and 3d are the same as those of the foregoing constant-length units 3a and 3b. Details are not described herein again. Through cooperation of the four rotating parts and the four constant-length units, stability of rotation of two body parts 200 can be ensured.

As shown in FIG. 11, the rotating mechanism 100 further includes an appearance shielding component 4. The appearance shielding component 4 is located on a side that is of a guide shaft 1 and that is away from a flexible display 300. In other words, the guide shaft 1 is located between the appearance shielding component 4 and the flexible display 300. In this way, the appearance shielding component 4 is located between two groups of rotating parts in a folded state. The appearance shielding component 4 may shield back surfaces of the rotating parts 2a and 2b, so that a back surface structure of a foldable terminal is simple.

Figure 12:
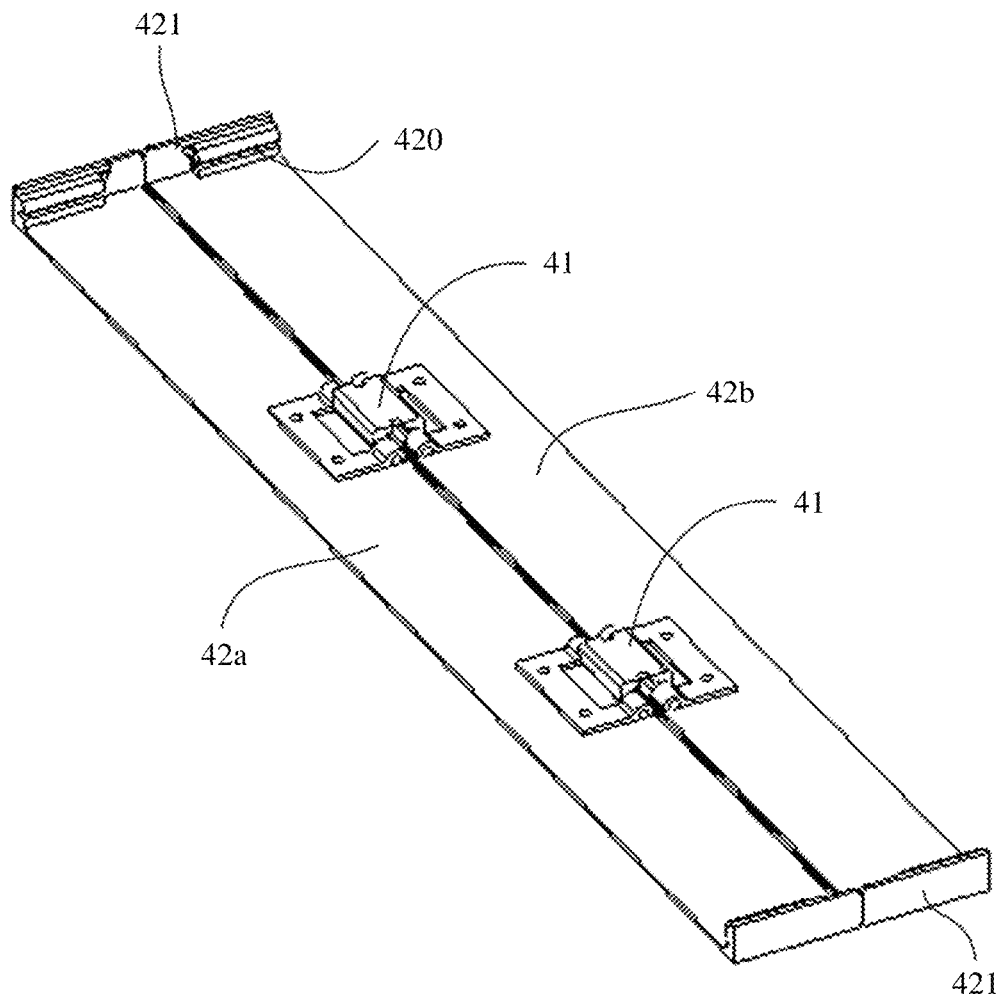
FIG. 12 is a schematic structural diagram of the appearance shielding component in FIG. 11.

As shown in FIG. 12, the appearance shielding component 4 includes a middle shaft 41 and two shielding plates 42a and 42b. The two shielding plates 42a and 42b each are rotationally connected to the middle shaft 41. The middle shaft 41 is located between the shielding plates 42a and 42b and the guide shaft 1. In this way, the middle shaft 41 is shielded inside the foldable terminal. There may be one, two, or more middle shafts 41, which are arranged in a length direction of the guide shaft 1, to ensure stability of relative rotation of the two shielding plates 42a and 42b.

The shielding plate 42a cooperates with the rotating parts 2a and 2c in a sliding manner, and the shielding plate 42b cooperates with the rotating parts 2b and 2d in a sliding manner, so that the shielding plates can slide in relative to the rotating parts in a folding process or an unfolding process. Side baffle parts 421 are disposed on two opposite side ends of each of the shielding plates 42a and 42b in a shaft direction of the guide shaft 1. The rotating part and the constant-length unit are located between the two side baffle parts 421 of each of the shielding plates 42a and 42b. The side baffle part 421 may shield a side end part of the rotating part, to simplify appearances of two side end parts of the foldable terminal. Sliding slots 420 are disposed on the side baffle parts 421 of the shielding plates 42a and 42b. A side protrusion 25 is disposed on a side end of the rotating part 2a, and the side protrusion 25 is disposed in the sliding slot 420 in a sliding manner. The side protrusion 25 cooperates with the sliding slot 420 in a sliding manner, to implement relative sliding between the shielding plates 42a and 42b and the rotating part.

Figure 13:
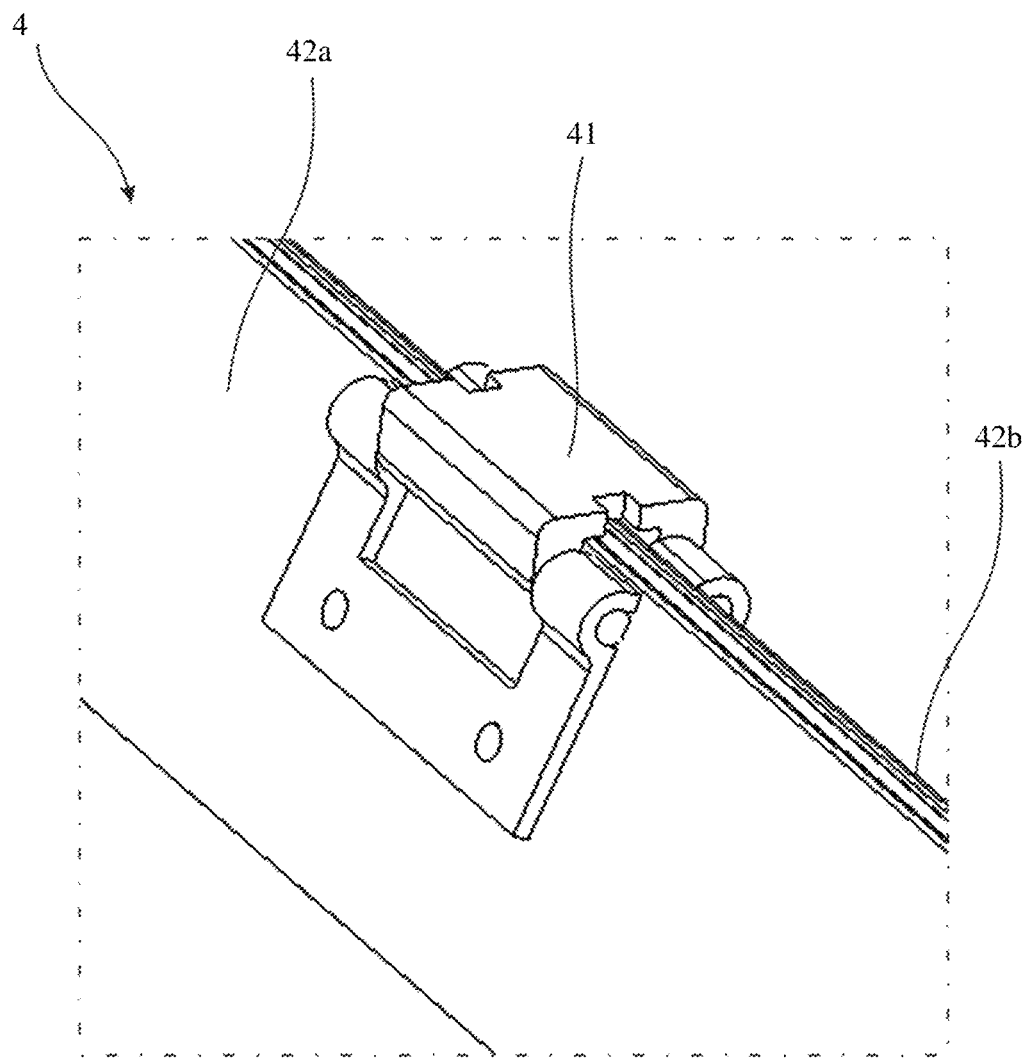
FIG. 13 is a diagram of an enlarged part of the appearance shielding component in FIG. 12.
Figure 14:
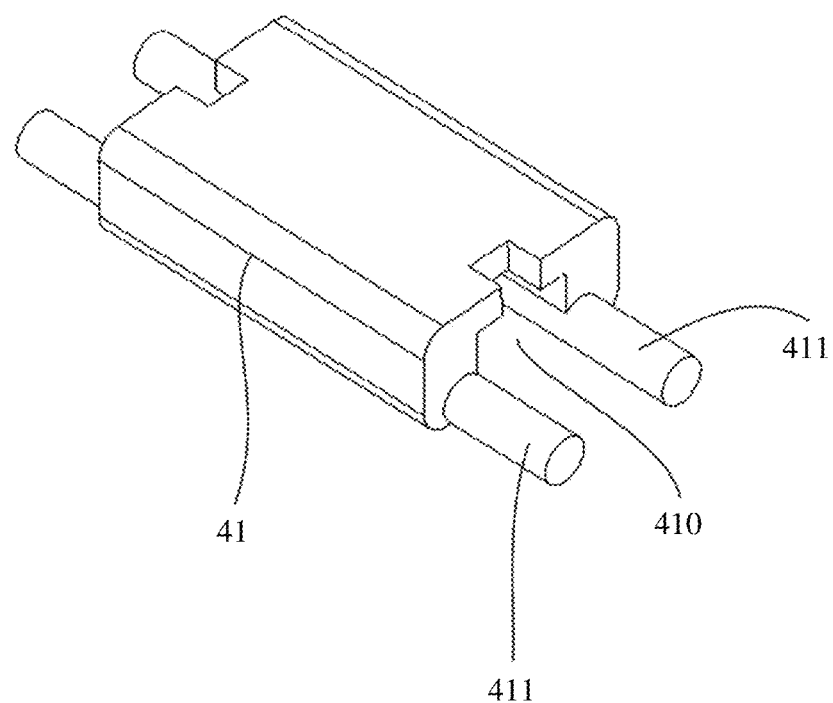
FIG. 14 is a schematic structural diagram of a middle shaft of the appearance shielding component in FIG. 12.

As shown in FIG. 13 and FIG. 14, a middle slot 410 is disposed on a side, far away from the guide shaft 1, of the middle shaft 41. Two sub-shafts 411 are disposed on the middle shaft 41. The middle slot 410 is located between the two sub-shafts 411. More specifically, the two sub-shafts 411 are respectively located on two opposite slot walls of the middle slot 410. The two shielding plates 42a and 42b are rotationally connected to the two sub-shafts 411 respectively. In a folded state, close end parts of the two shielding plates 42a and 42b are located in the middle slot 410. In an unfolded state, the close end parts of the two shielding plates 42a and 42b press against each other. The close end parts of the two shielding plates 42a and 42b can be accommodated by using the middle slot 410, to ensure that the close end parts of the two shielding plates 42a and 42b can press against each other in the unfolded state, to completely shield the guide shaft 1 and the two rotating parts 2a and 2b. During folding or unfolding, the two shielding plates 42a and 42b are in relative to the middle shaft 41, and the middle shaft 41 may slide in a thickness direction of the foldable terminal, to adapt to folding and unfolding of the entire foldable terminal.

End parts that are far away from each other and that are of the two shielding plates 42a and 42b are respectively connected to internal parts of the two body parts 201 in a sliding manner, so that the shielding plates 42 can slide to the internal parts of the two body parts 201 in the folded state.

As shown in FIG. 4, guide end plates 13 are disposed on two ends of the guide shaft 1. The guide end plates 13 can shield side ends of the rotating parts 2a and 2b. In the folded state, the guide end plates 13 can prevent internal parts of the rotating parts 2a and 2b from being exposed. The guide end plate 13 may be located on an inner side of the side baffle part 421, or the guide end plate 13 may be located on an outer side of the side baffle part 421.

Figure 15:
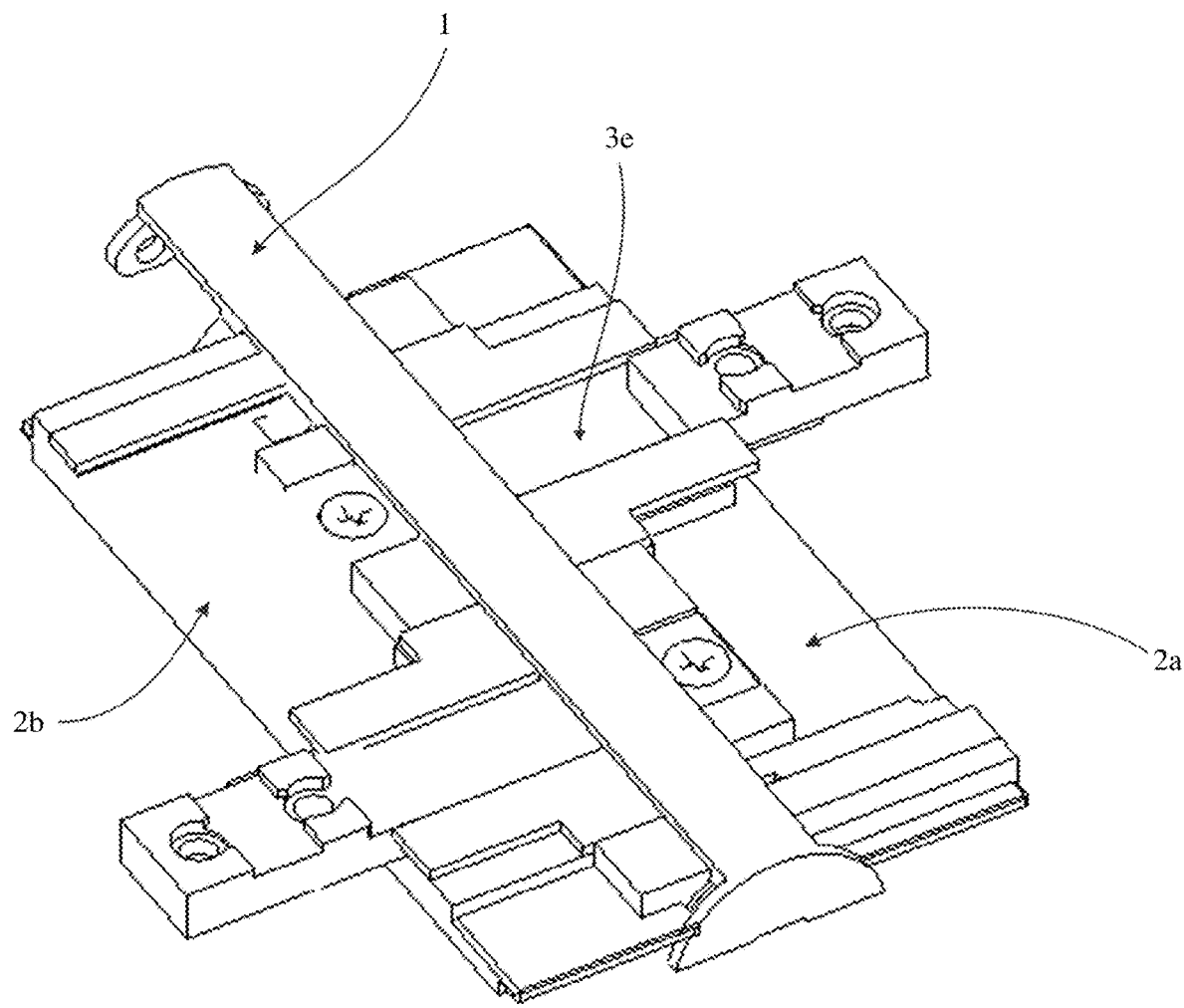
FIG. 15 is a schematic structural diagram of a rotating mechanism according to another embodiment of the present invention.
Figure 16:
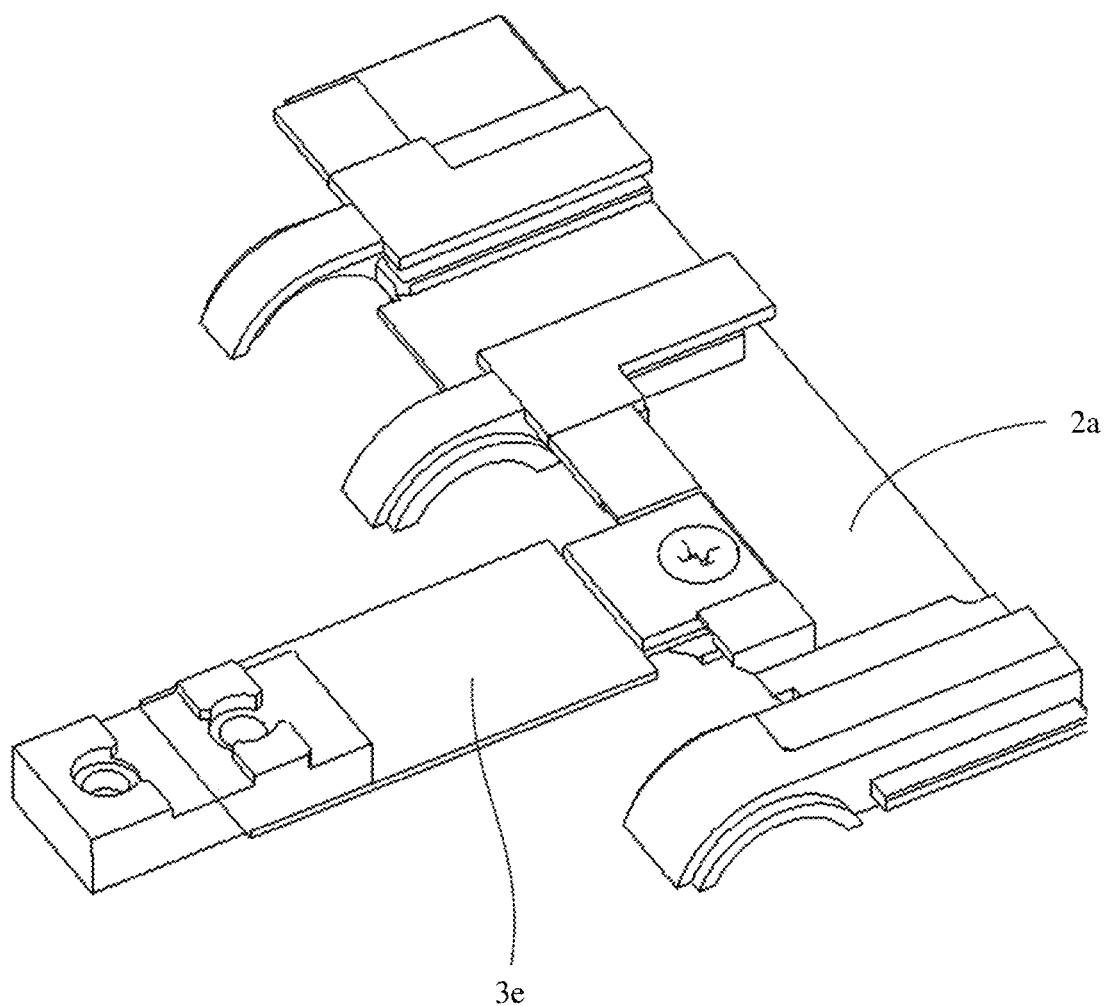
FIG. 16 is a schematic structural diagram of a rotating part and a constant-length unit of the rotating mechanism in FIG. 15.
Figure 17:
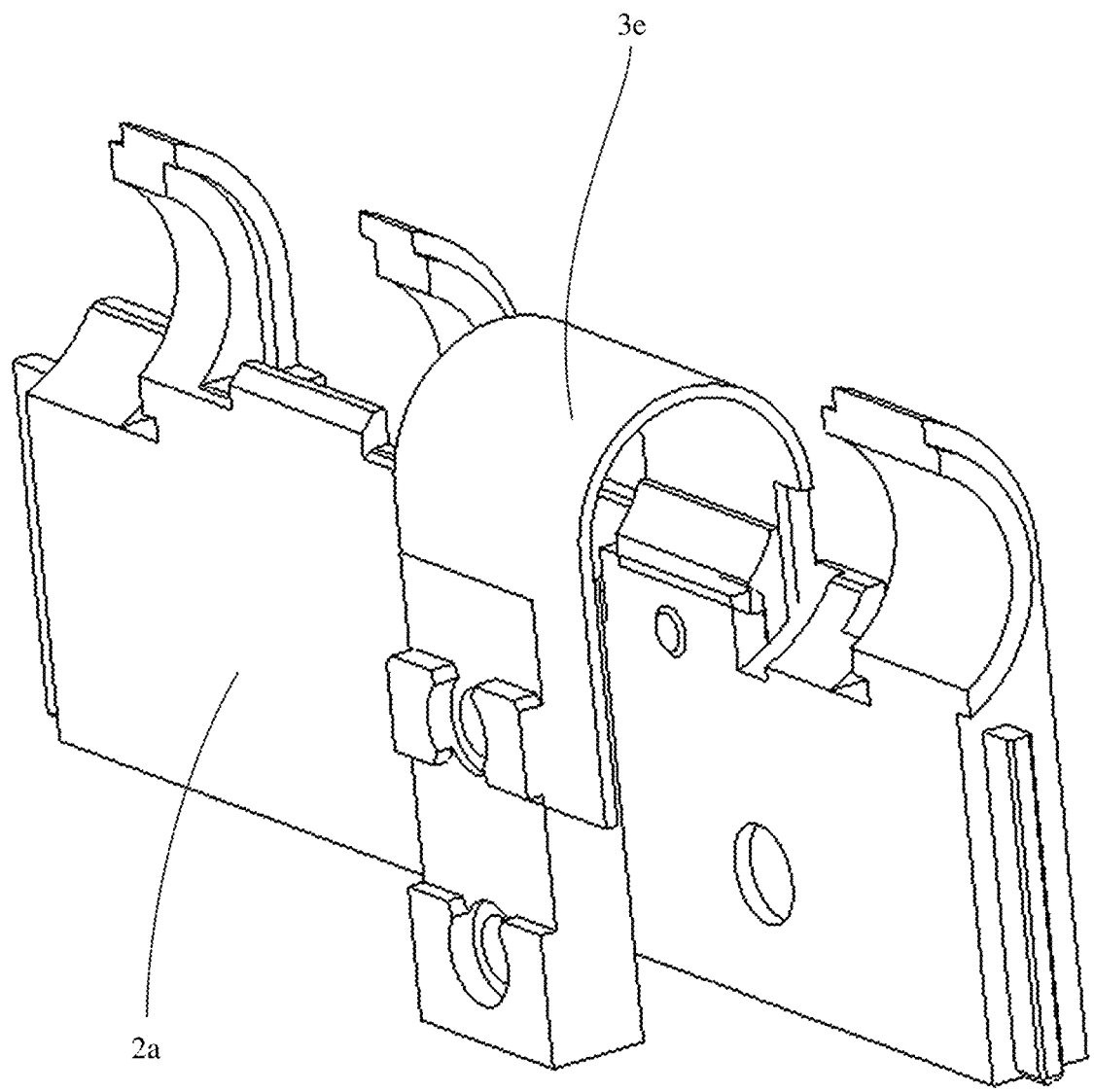
FIG. 17 is a schematic structural diagram of the constant-length unit in FIG. 15 in a bent state.

In the foregoing embodiment, the constant-length unit includes the plurality of chain segments 30. In addition, in another embodiment, as shown in FIGS. 15 to 17, a constant-length unit 3e may alternatively be made of a shape-memory alloy, and bending of the constant-length unit 3e is implemented by using a bendable characteristic of the shape-memory alloy. Certainly, in another embodiment, the constant-length unit may alternatively be made of a carbon fiber, a glass fiber, a plastic part, or another material that can be bent.

The rotating mechanism provided in the present invention is roughly presented as two symmetrical parts: a left part and a right part. The left part and the right part can be rotated around a middle guide shaft. During rotation, the left part and the right part can be coupled to each other in a sliding manner between a sliding block and a rotating part. When the left part is rotated, the right part is driven to slide, and when the right part is rotated, the left part is driven to slide. A connection line with a constant length L exists between two sliding blocks, and a flexible display is located at the connection line. In this way, after a mechanical part in a body part is fixedly connected to a sliding part, the rotating part cooperates with the corresponding body part to slide, so that a total length of a foldable device remains unchanged in a rotating and folding process, and the flexible display does not bear a driving force required for sliding of a rotating shaft.

An overall solution of the rotating mechanism is implemented by using the rotating part and the appearance shielding component together. The rotating part can implement folding of a terminal device. In a folding process, no additional pull force is exerted on the flexible display, so that the display can be effectively protected. In addition, when the device is squeezed in the unfolded state, the guide shaft does not independently slide, so that the display does not arch and is not damaged. A shielding part may be disposed with reference to the two rotating parts. The shielding part can also be divided into two symmetric parts. Two shielding parts are respectively located on two sides of the guide shaft. The two shielding parts are connected by using a floating middle shaft. In the folding process, an overall appearance of the mechanism can be simplified.

An embodiment of the present invention further provides a display apparatus, including a flexible display and the rotating mechanism in the foregoing embodiments. The flexible display includes two fastened parts and one bent part. The two fastened parts are fixedly connected to the two body parts respectively. The two fastened parts are fixedly disposed with the sliding blocks on the two sides of the guide shaft respectively. The bent part is disposed in relative to the guide shaft.

It may be understood that the display apparatus may be applied to a foldable terminal such as a foldable mobile phone, a foldable display, or a foldable tablet computer.

What is claimed is:

1. A rotating mechanism, comprising:
a guide shaft;
at least two rotating parts; and
at least two constant-length units, wherein the rotating parts are disposed on two sides of the guide shaft, an arc-shaped slot is disposed on the guide shaft, an arc-shaped part is disposed on the rotating part, the arc-shaped part is disposed in the arc-shaped slot in a sliding manner, so that the rotating part can be rotated in relative to the guide shaft, the constant-length units are each a long strip that has a fixed length and that can be bent, the constant-length units each have a positioning end and a sliding end that correspond to each other in a length direction of the constant-length units, the positioning end is fixedly connected to or rotationally connected to the rotating part located on one side of the guide shaft, the sliding end is connected, in a sliding manner along the length direction of the constant-length units, to the rotating part located on the other side of the guide shaft, and the positioning end and the sliding end are disposed on each rotating part.

2. The rotating mechanism according to claim 1, wherein the guide shaft comprises:
a first sub-shaft and a second sub-shaft, the first sub-shaft and the second sub-shaft are parallel to each other and are disposed in relative to each other, the first sub-shaft and the second sub-shaft are fixedly connected, and the arc-shaped slot is a gap disposed between the first sub-shaft and the second sub-shaft.

3. The rotating mechanism according to claim 1, wherein an arc-shaped guide slot is disposed on the guide shaft, and one of the constant-length units slides through the arc-shaped guide slot.

4. The rotating mechanism according to claim 1, wherein:
the constant-length units comprises a plurality of chain segments, the plurality of chain segments is connected in series, and two adjacent chain segments are rotationally connected; or
the constant-length units are made of a material that can be bent.

5. The rotating mechanism according to claim 1, wherein a sliding slot is disposed on the rotating part, the sliding slot has two slot walls disposed opposite to each other, a slide rail is disposed on each of the slot walls, a sliding block is disposed on the sliding end of the constant-length units, the sliding block is disposed in the sliding slot in a sliding manner, sliding ears are disposed on two opposite sides of the sliding block, and the sliding ears are disposed in the slide rail in a sliding manner.

6. The rotating mechanism according to claim 5, wherein the rotating part comprises:
a rotating plate and at least two rotating blocks, the rotating blocks are all fastened on the rotating plate, two of the rotating blocks are disposed with a gap, the gap between the two rotating blocks forms the sliding slot, and the slide rail is disposed between the rotating block and the rotating plate.

7. The rotating mechanism according to claim 6, wherein the arc-shaped part is disposed on each of the rotating blocks, and the constant-length units are limited between two arc-shaped parts.

8. The rotating mechanism according to claim 1, wherein the rotating mechanism further comprises:
an appearance shielding component, the appearance shielding component comprises a middle shaft and two shielding plates, the two shielding plates each are rotationally connected to the middle shaft, and the two shielding plates respectively cooperate with the rotating parts on the two sides of the guide shaft in a sliding manner.

9. The rotating mechanism according to claim 8, wherein a middle slot is disposed on a side, far away from the guide shaft, of the middle shaft, two sub-shafts are disposed on the middle shaft, and the middle slot is located between the two sub-shafts; the two shielding plates are rotationally connected to the two sub-shafts respectively; in a folded state, close end parts of the two shielding plates are located in the middle slot; and in an unfolded state, the close end parts of the two shielding plates press against each other.

10. A foldable terminal, comprising:
a rotating mechanism;
two body parts;
and a flexible display, wherein the two body parts are connected by using the rotating mechanism, the flexible display comprises two fastened parts and one bent part, the two fastened parts are fixedly connected to the two body parts respectively, and the bent part is disposed in relative to the rotating mechanism;
wherein the rotating mechanism comprises a guide shaft, at least two rotating parts, and at least two constant-length units, wherein the rotating parts are disposed on two sides of the guide shaft, an arc-shaped slot is disposed on the guide shaft, an arc-shaped part is disposed on the rotating part, the arc-shaped part is disposed in the arc-shaped slot in a sliding manner, so that the rotating part can be rotated in relative to the guide shaft, the constant-length units are each a long strip that has a fixed length and that can be bent, the constant-length units each have a positioning end and a sliding end that correspond to each other in a length direction of the constant-length units, the positioning end is fixedly connected to or rotationally connected to the rotating part located on one side of the guide shaft, the sliding end is connected, in a sliding manner along the length direction of the constant-length units, to the rotating part located on the other side of the guide shaft, and the positioning end and the sliding end are disposed on each rotating part.

11. The foldable terminal according to claim 10, wherein the guide shaft comprises:
a first sub-shaft and a second sub-shaft, the first sub-shaft and the second sub-shaft are parallel to each other and are disposed in relative to each other, the first sub-shaft and the second sub-shaft are fixedly connected, and the arc-shaped slot is a gap disposed between the first sub-shaft and the second sub-shaft.

12. The foldable terminal according to claim 10, wherein an arc-shaped guide slot is disposed on the guide shaft, and one of the constant-length units slides through the arc-shaped guide slot.

13. The foldable terminal according to claim 10, wherein:
the constant-length units comprises a plurality of chain segments, the plurality of chain segments is connected in series, and two adjacent chain segments are rotationally connected; or
the constant-length units are made of a material that can be bent.

14. The foldable terminal according to claim 10, wherein a sliding slot is disposed on the rotating part, the sliding slot has two slot walls disposed opposite to each other, a slide rail is disposed on each of the slot walls, a sliding block is disposed on the sliding end of the constant-length units, the sliding block is disposed in the sliding slot in a sliding manner, sliding ears are disposed on two opposite sides of the sliding block, and the sliding ears are disposed in the slide rail in a sliding manner.

15. The foldable terminal according to claim 14, wherein the rotating part comprises:
a rotating plate and at least two rotating blocks, the rotating blocks are all fastened on the rotating plate, two of the rotating blocks are disposed with a gap, the gap between the two rotating blocks forms the sliding slot, and the slide rail is disposed between the rotating block and the rotating plate.

16. The foldable terminal according to claim 15, wherein the arc-shaped part is disposed on each of the rotating blocks, and the constant-length units are limited between two arc-shaped parts.

17. The foldable terminal according to claim 10, wherein the rotating mechanism further comprises:
an appearance shielding component, the appearance shielding component comprises a middle shaft and two shielding plates, the two shielding plates each are rotationally connected to the middle shaft, and the two shielding plates respectively cooperate with the rotating parts on the two sides of the guide shaft in a sliding manner.

18. The foldable terminal according to claim 17, wherein:
a middle slot is disposed on a side, far away from the guide shaft, of the middle shaft, two sub-shafts are disposed on the middle shaft, and the middle slot is located between the two sub-shafts;
the two shielding plates are rotationally connected to the two sub-shafts respectively;
in a folded state, close end parts of the two shielding plates are located in the middle slot; and
in an unfolded state, the close end parts of the two shielding plates press against each other.

* * * * *